United States Patent [19]

Campardo

[11] Patent Number: 4,949,307

[45] Date of Patent: Aug. 14, 1990

[54] CIRCUIT FOR SENSING THE STATE OF MATRIX CELLS IN MOS EPROM MEMORIES INCLUDING AN OFFSET CURRENT GENERATOR

[75] Inventor: Giovanni Campardo, Bergamo, Italy

[73] Assignee: SGS-THOMSON Microelectronics srl, Milan, Italy

[21] Appl. No.: 298,487

[22] Filed: Jan. 18, 1989

[30] Foreign Application Priority Data

Jan. 29, 1988 [IT] Italy ................................. 19254 A/88

[51] Int. Cl.⁵ .............................................. G11L 13/00
[52] U.S. Cl. .................................... 365/201; 365/207; 365/189.09; 371/11.1
[58] Field of Search ............... 365/201, 207, 182, 242, 365/189.09; 371/11

[56] References Cited

U.S. PATENT DOCUMENTS 4,802,166 1/1989 Casagrande et al. ................ 371/21
4,807,188 2/1989 Casagrande ........................ 365/182

Primary Examiner—Terrell W. Fears
Attorney, Agent, or Firm—Stevens, Davis, Miller & Mosher

[57] ABSTRACT

The matrix cells and a virgin reference cell have their respective drains connected to a supply voltage through respective identical loads; a selection voltage is applied to the gate of a chosen matrix cell and to the gate of the virgin reference cell and the respective currents flowing across the two cells are compared in a differential amplifier. According to the invention, a generator is connected to the node between the drain of the reference cell and the voltage supply, and generates an offset current which is substantially constant as the supply voltage varies.

3 Claims, 4 Drawing Sheets

CIRCUIT FOR SENSING THE STATE OF MATRIX CELLS IN MOS EPROM MEMORIES INCLUDING AN OFFSET CURRENT GENERATOR

BACKGROUND OF THE DISCLOSURE

1. Field of the Invention

The present invention relates to circuit for sensing the state of matrix cells in MOS EPROM memories including an offset current generator.

2. Prior Art

Essentially two kinds of circuits for sensing the content of EPROM memory cells are known:
 (a) the unbalanced-load type;
 (b) the type with current offset towards the ground.

In unbalanced-load circuits, the load on the reference cell is typically twice that of the matrix cells. This type of circuit can operate with very low values of the supply voltage $V_{cc}$, which in practice coincides with the threshold voltage of the virgin cell, but its maximum voltage is limited, since it is determined by the crossing between the characteristic curve of the written cell and that of the reference cell. The performance of the circuit is therefore limited as the supply voltage varies upwards.

In order to solve this problem, circuits with a current offset towards the ground have been introduced, wherein the characteristic curves of the reference cell, of the virgin cell and of the written cell are parallel. However this type of circuit, too, has new disadvantages, i.e.: the value of the minimum $V_{cc}$ is satisfactory for the virgin cell, but for the written cell it is determined by the crossing between the characteristic curve of the reference cell and that of the written cell, and is higher than in unbalanced-load circuits.

Besides the above described problem, which is of a static nature, the circuit with current offset towards the ground also has a dynamic disadvantage. In fact, while during the reading of a virgin cell the current in the branch of the matrix cell always absorbs a higher current than the reference side, and therefore their difference can be sensed immediately, in the case of a written cell the currents in the two branches are initially identical, since the written cell in any case absorbs a current equal to the offset current, and said current starts to be greater than the offset current only after a certain period of delay. This wait time constitutes a delay which extends the total access time of the device during a read operation.

A current offset circuit is described, by way of example, in the antedated Italian patent application No. 21682-A/86 filed on Sept. 12, 1986, and entitled "Circuito di rilevamento dello stato di celle di matrice in memorie EPROM in tecnologia MOS", to which reference is made for a detailed description of its operation and for a general discussion of the problems of sensing EPROM memory cells and unbalanced-load circuits.

SUMMARY OF THE INVENTION

In order to overcome the above described disadvantages of the prior art, the aim of the present invention is thus to provide a circuit for sensing the state of matrix cells in EPROM memories which, though it has parallel sensing characteristic curves, so as to cause no limitation of the maximum supply voltage, also has no problems in minimum supply (i.e. it behaves in this respect like unbalanced-load circuits) and causes no reading delays due to the current offset.

The invention achieves the above described aim and other objects and advantages, as will become apparent from the continuation of the description, with a circuit for sensing the virgin or written state of matrix cells in MOS EPROM memories, wherein the matrix cells and a virgin reference cell have their respective drains connected to a supply voltage through respective identical loads, a selection voltage is applied at the gate of a chosen matrix cell and to the gate of the virgin reference cell and the respective currents flowing across the two cells are compared in a differential amplifier, characterized in that an offset current generator is connected between the drain of the reference cell and the voltage supply.

BRIEF DESCRIPTION OF THE DRAWINGS

The invention is now described in further detail with reference to some preferred embodiments thereof illustrated in the accompanying drawings, given merely by way of non-limitative example, wherein.

DETAILED DESCRIPTION OF THE PREFERRED EMBODIMENTS

Figure 1:
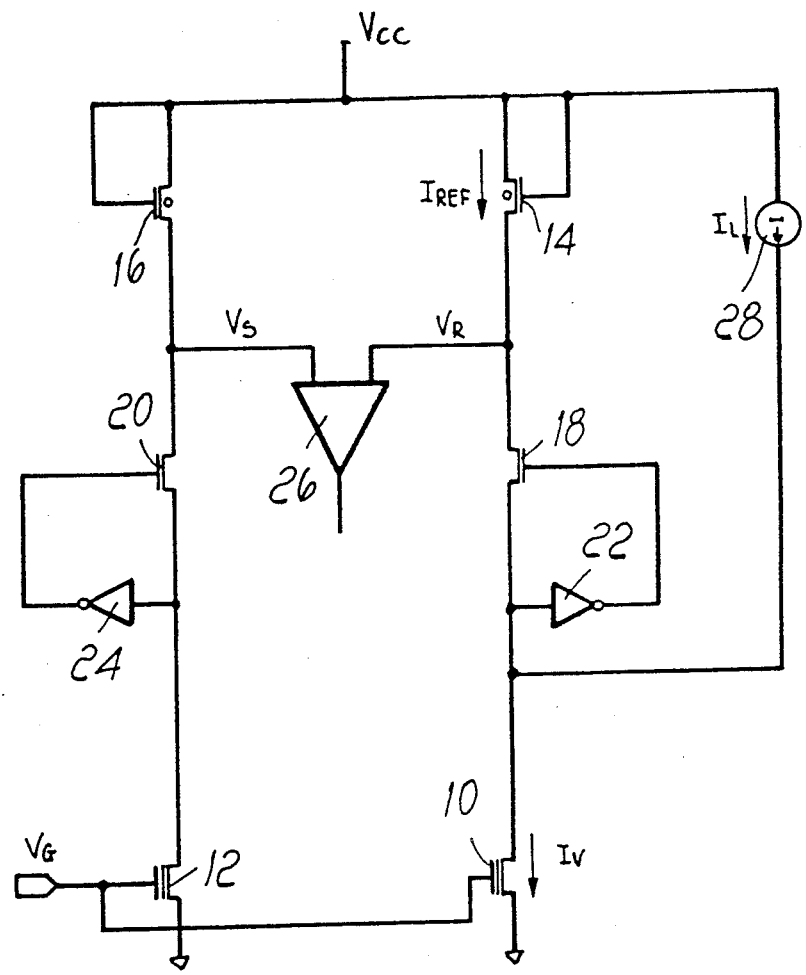
FIG. 1 is a simplified diagram of a sensing circuit according to a first embodiment of the invention.

With reference to FIG. 1, the reference numerals 10 and 12 respectively indicate a virgin reference cell and a matrix cell of a MOS EPROM memory. The source of two cells 10 and 12 are connected to the ground, and their gates are driven in common by a selection voltage $V_G$. The drains of the two cells 10 and 12 are fed by a supply voltage $V_{cc}$ through respective natural load transistors 14, 16 with high gates, arranged in series to respective N-channel transistors 18, 20 the gates whereof are driven by inverters 22, 24, and having the purpose of maintaining, during reading and in a per se known manner, the drains of the cells at such voltage values as to cause no spurious writings. The node $V_R$ between the transistors 14 and 18, on the reference side, and the node $V_S$ between the transistors 16 and 20, on the matrix side, are connected to the two inputs of a differential sense amplifier 26.

According to the invention, a current generator 28 is connected between the power supply $V_{cc}$ and the node $V_R$ (i.e. the drain of the reference cell 10) and injects an offset current $I_L$ in the reference cell 10. The current flowing in the load of the reference cell is thus the difference between the current absorbed by the reference cell 10, which is virgin, and that delivered by the offset generator 28 in a constant manner.

Figure 2:
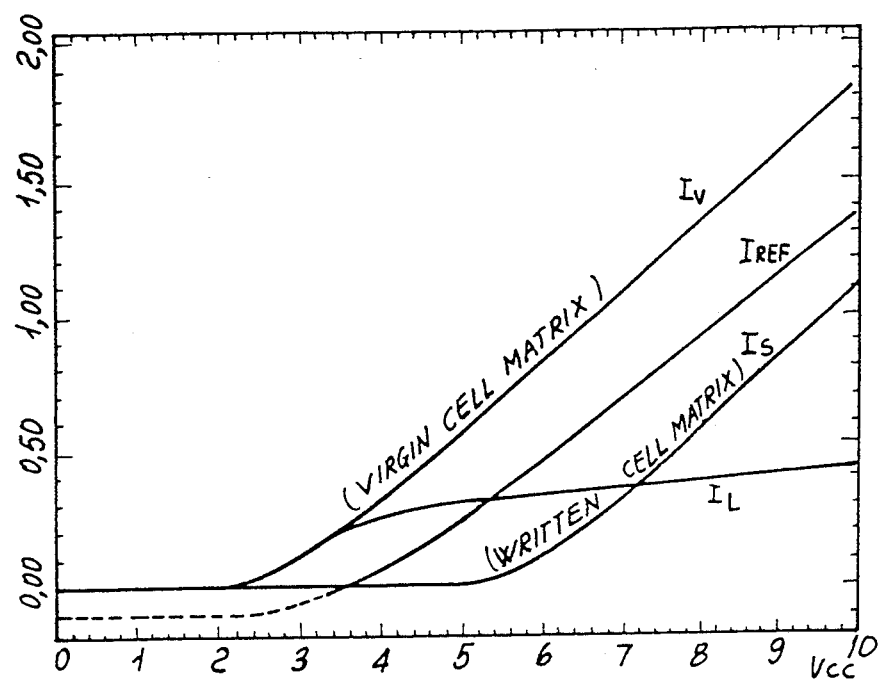
FIG. 2 is a graph of the static current characteristic curves of operation of the circuit of FIG. 1.
Figure 3:
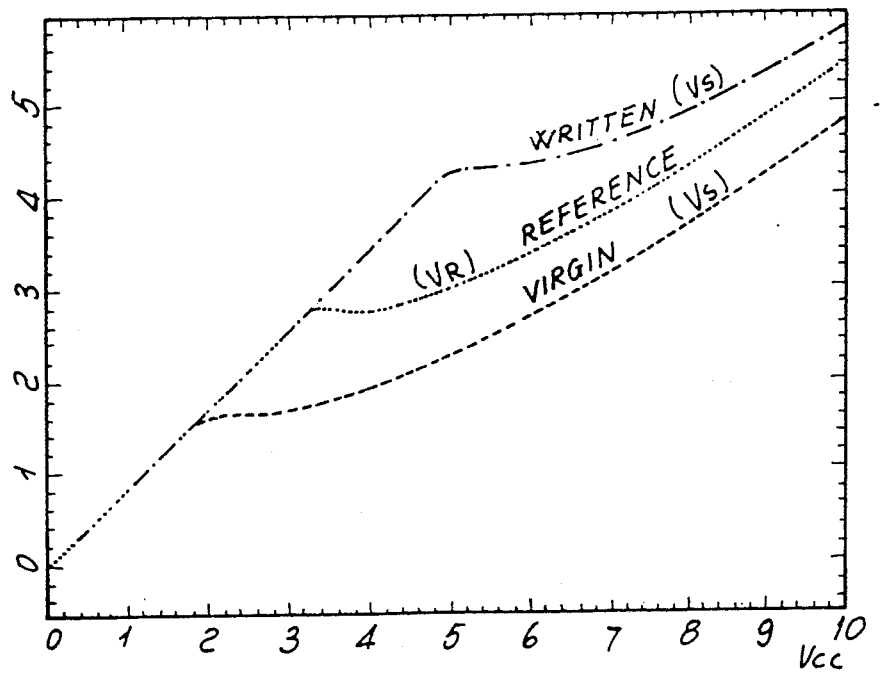
FIG. 3 is a graph of the static characteristic curves of operation of the circuit of FIG. 1 for the voltages on the output nodes.

The characteristic curves $I_v$ for the virgin cell. $I_S$ for the written cell and $I_{rel}$ for the reference cell, as they result from simulation with the ideal circuit arrangement of FIG. 1, are shown in FIG. 2, which also illustrates the behavior of the offset circuit $I_L$. The reference threshold is shifted downward. This is in contrast with what is known from the prior method of current offset, according to which the contribution of current occurred towards the ground on the matrix side: according to the invention the contribution of current is towards the power supply on the reference side. FIG. 3 shows the characteristic curves of the voltages on the output nodes, also obtained by simulation, both for the reference cell ($V_R$) and for the written and virgin matrix cells ($V_S$).

As can be seen from the graph of FIG. 2, the characteristic curve of the reference current is no longer in an intermediate position between the characteristic curves of the virgin cell and of the written cell when the supply voltage drops below certain limits. This can give rise to spurious readings for very low supply voltages. In order to avoid this condition, it would be desirable to have a constant offset current only starting from a certain value of $V_{cc}$.

Figure 4:
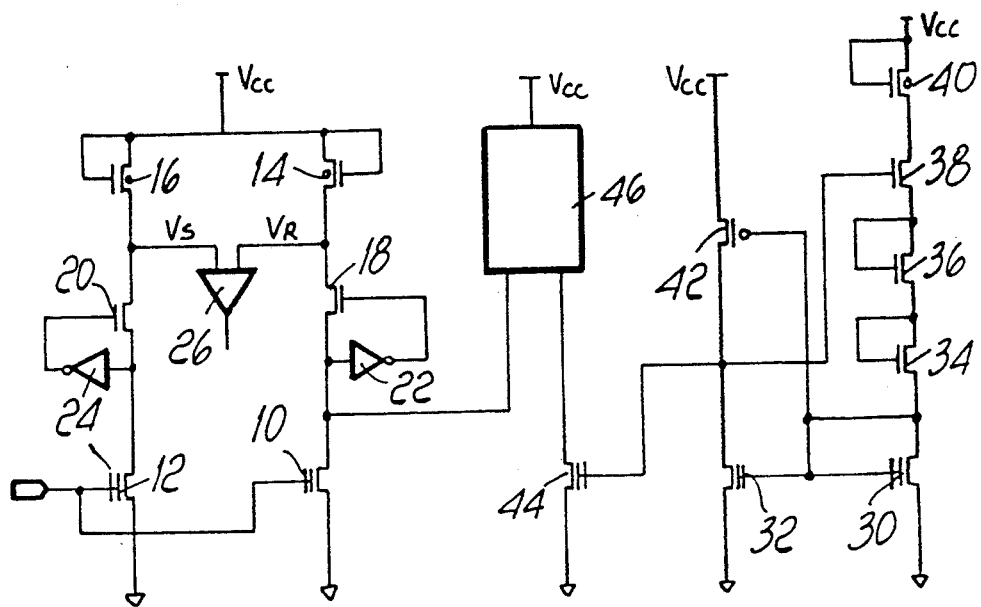
FIG. 4 is a diagram of a sensing circuit according to another embodiment of the invention.

According to a more perfected embodiment of the invention, the offset current generator 28 is constituted as illustrated in FIG. 4. A constant voltage generator $V_{rel}$ is used, formed by two virgin cells 30, 32 with gates connected in common to the drain of the cell 30, and with unbalanced loads. The load of the cell 30 comprises two saturated transistors 34, 36 arranged in series, a transistor 38 controlled in negative feedback as described hereafter, and a natural transistor 40, also having a high gate. The load of the cell 32 is constituted by a P-channel transistor 42, the gate whereof is also controlled by the drain of the cell 30.

The output voltage ($V_{rel}$) in the node between the drain of the virgin cell 32 and the source of the transistor 42 is given by the sum of the voltage drops between the sources and the gates of the transistors 30, 34, 36 and 38. The stability of said voltage is ensured by the negative feedback obtained by applying the same voltage $V_{rel}$ to the gate of the transistor 38.

The voltage $V_{rel}$ is applied, by means of a further virgin cell 44, to a current mirror 46 the output whereof constitutes the offset current $I_L$. Per se known circuits having the purpose of keeping the drain of the cells at such a voltage as to prevent a spurious reading may be connected on the input and output branches of the current mirror 46.

By producing the reference voltage $V_{rel}$ starting from virgin cells, the creation of the offset current is scarcely influenced by the variations of the manufacturing process.

Figure 5:
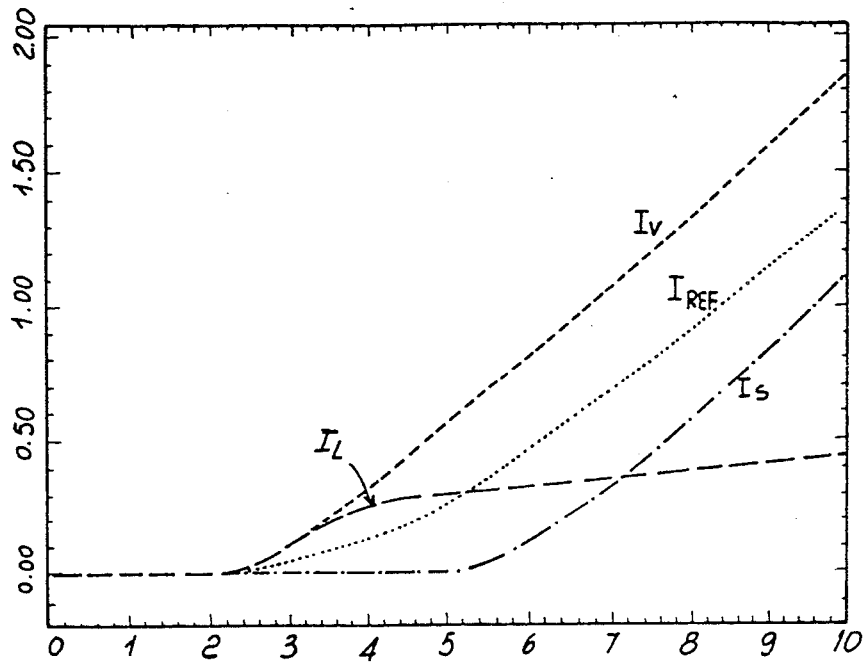
FIG. 5 is a graph of the static current characteristic curves of operation of the circuit of FIG. 4.
Figure 6:
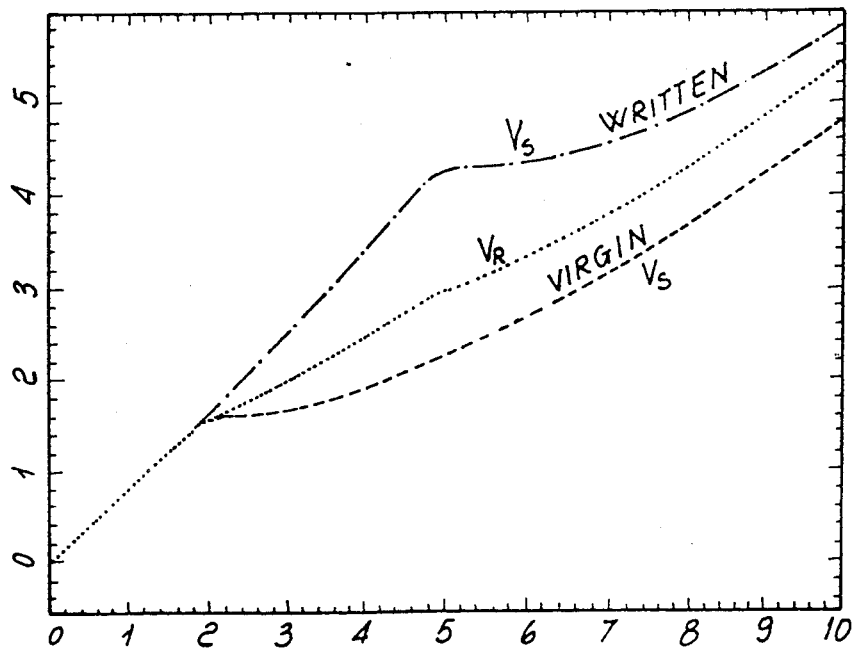
FIG. 6 is a graph of the static characteristic curves of operation of the circuit of FIG. 4 for the voltages on the output nodes.

The static characteristic curves obtained with the circuit of FIG. 4, obtained by simulation, are illustrated in the graphs of FIGS. 5 and 6, where it can be seen that the three characteristic curves are always separated, even for a very low $V_{cc}$, and the problem of the minimum operating supply voltage is thus solved.

The behavior of the circuit according to FIG. 4 is now analyzed from a dynamic point of view.

When reading a virgin cell, the load of the reference side delivers less current than the load of the matrix side, since part of the current required by the cell is provided by the offset. Less current thus always flows across the reference load, and the voltage drop on the node $V_R$ (FIG. 4) is consequently always greater than on the node $V_S$.

When reading a written cell, the node $V_S$ is always higher, with no uncertainty.

Figure 7:
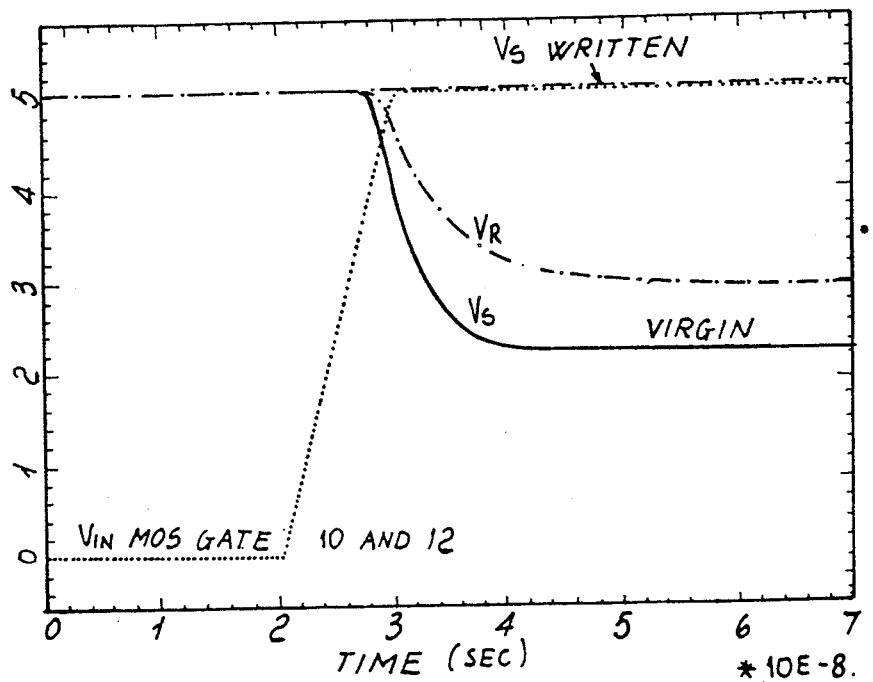
FIG. 7 is a graph of the dynamic characteristic curves of operation of the circuit of FIG. 4.

FIG. 7 illustrates the dynamic behavior, obtained by simulation, for both a written cell and a virgin cell. It can be seen that there is no time difference between the beginning of the separation of the characteristic curves during a virgin cell reading phase and during a written cell reading phase. The only possible difference may be caused, in the practical case, by the sensitivity of the amplifier stage which follows.

Some preferred embodiments of the invention have been described, but naturally they are susceptible to modifications and variations which are obvious to the expert in the field according to the given teachings without thereby abandoning the scope of the inventive concept as it results from the accompanying claims.

I claim:

1. A circuit for sensing the virgin or written state of a matrix cell in MOS EPROM memories comprising:
   (a) at least one matrix cell;
   (b) a plurality of load means;
   (c) a virgin reference cell, said matrix cell and said virgin reference cell having their respective sources connected to ground, having their respective drains connected to a voltage supply through respective ones of said plurality of load means, and their respective gates mutually interconnected with one another and controlled by a selection voltage;
   (d) a differential amplifier having a first input and a second input respectively connected to said respective ones of said load means, said differential amplifier sensing the respective currents flowing across said virgin reference cell and said matrix cell; and
   (e) a current generator means interconnecting the drain of said virgin reference cell and the supply voltage, for generating continuously a current which is constant when the voltage output by said voltage supply varies.

2. A circuit for sensing the virgin or written state of a matrix cell in MOS EPROM memories comprising:
   (a) at least one matrix cell;
   (b) a plurality of load means;
   (c) a virgin reference cell, said matrix cell and said virgin reference cell having their respective sources connected to ground, having their respective drains connected to a voltage supply through respective ones of said plurality of load means, and their respective gates mutually interconnected to one another and controlled by a selection voltage;
   (d) a differential amplifier having a first input and a second input respectively connected to said respective ones of said load means, said differential amplifier sensing the respective currents flowing across said virgin reference cell and said matrix cell; wherein said current generator means generates (i) a current which is linearly proportional to said voltage output of said voltage supply, for values of said voltage output in a range between the threshold voltage of said virgin reference cell and a preset voltage, and (ii) a constant current for values of said voltage output higher than said preset value.

3. A circuit for sensing the virgin or written state of a matrix cell in MOS EPROM memories comprising:
   (a) at least one matrix cell;
   (b) a plurality of load means;
   (c) a virgin reference cell, said matrix cell and said virgin reference cell having their respective sources connected to ground, having their respective drains connected to a voltage supply through respective ones of said plurality of load means, and their respective gates mutually interconnected to one another and controlled by a selection voltage;

(d) a differential amplifier having a first input and a second input respectively connected to said respective ones of said load means, said differential amplifier sensing the respective currents flowing across said virgin reference cell and said matrix cell;

(e) a second virgin cell;
(f) a current mirror; and
(g) a constant voltage generator which drives said current mirror through said second virgin cell, said current mirror having an output interconnecting the drain of said virgin reference cell and the voltage supply, said current mirror generating at said output thereof an offset current which is constant when the voltage output by said voltage supply varies.

* * * * *